United States Patent

Rapeli

[11] Patent Number: 5,991,605
[45] Date of Patent: Nov. 23, 1999

[54] METHOD AND CIRCUIT FOR CREATING A MODULATED SIGNAL IN A TRANSCEIVER

[75] Inventor: Juha Rapeli, Oulu, Finland

[73] Assignee: Nokia Mobile Phones Ltd., Espoo, Finland

[21] Appl. No.: 08/875,260

[22] PCT Filed: Jan. 5, 1996

[86] PCT No.: PCT/FI96/00015

§ 371 Date: Jul. 22, 1997

§ 102(e) Date: Jul. 22, 1997

[87] PCT Pub. No.: WO96/23366

PCT Pub. Date: Aug. 1, 1996

[30] Foreign Application Priority Data

Jan. 24, 1995 [FI] Finland ................... 950295

[51] Int. Cl.⁶ ............... H01Q 11/12; H04B 1/06
[52] U.S. Cl. ............ 455/76; 455/118; 455/260; 455/262
[58] Field of Search ............... 455/76, 84, 85, 455/86, 118, 119, 110, 112, 113, 260, 262; 375/308; 332/103, 127, 128

[56] References Cited

U.S. PATENT DOCUMENTS

| 4,225,828 | 9/1980 | Watanabe et al. | 455/76 |
|---|---|---|---|
| 4,325,031 | 4/1982 | Ooms et al. | 327/107 |
| 4,755,774 | 7/1988 | Heck | 455/113 |
| 5,065,408 | 11/1991 | Gillig | 455/76 |
| 5,079,520 | 1/1992 | Rapeli | 331/100 |
| 5,291,474 | 3/1994 | Ikonen et al. | 370/30 |
| 5,301,367 | 4/1994 | Heinonen | 455/76 |
| 5,325,075 | 6/1994 | Rapeli | 332/103 |
| 5,390,168 | 2/1995 | Vimpari | 370/30 |
| 5,471,652 | 11/1995 | Hulkko | 455/76 |
| 5,491,832 | 2/1996 | Malkamaki et al. | 455/33.1 |
| 5,519,885 | 5/1996 | Vaisanen | 455/76 |

FOREIGN PATENT DOCUMENTS

| 0 442 611 | 8/1991 | European Pat. Off. . | |
| 0 550 249 | 7/1993 | European Pat. Off. . | |
| 0 550 249 A2 | 7/1993 | European Pat. Off. | H03C 3/09 |
| 1161206 | 8/1969 | United Kingdom | H03B 3/04 |
| WO 95/16304 | 6/1995 | WIPO . | |

*Primary Examiner*—Dwayne D. Bost
*Assistant Examiner*—Raymond B. Persino
*Attorney, Agent, or Firm*—Perman & Green, LLP

[57] ABSTRACT

In the method and circuit for creating a modulated signal, one input signal of a phase comparator (509) of a phase-locked frequency synthesizer is an offset frequency ($f_2$), which is created from an adjustable oscillator's (511) output signal ($f_{TX}$) by mixing it with a mixer frequency ($f_1$) and filtering the obtained result in a low pass filter (508). The other input signal is a fixed reference frequency ($f_r$). The adjustable oscillator (511) is controlled with a control signal ($V_{CMOD}$), which contains a component resulting from the phase difference of said input signals ($f_r$, $f_2$). Modulation is created in the output signal ($f_{TX}$) of the loop by adding a frequency or phase change to at least one of the input signals ($f_r$, $f_2$) or their derivatives, advantageously with pulse delay technology.

15 Claims, 8 Drawing Sheets

METHOD AND CIRCUIT FOR CREATING A MODULATED SIGNAL IN A TRANSCEIVER

BACKGROUND OF THE INVENTION

The present invention relates to a method and circuit for creating a modulated signal with a frequency synthesizer based on a phase-locked loop. A fixed-frequency reference signal and a signal created by down-converting from the output signal of the frequency synthesizer are input to the phase comparator of the loop.

A known method of creating a modulated transmitting frequency is shown in FIG. 1. The transmission frequency $f_{TX}$ is generated in a closed phase-locked loop by controlling a voltage-controlled oscillator 109 (VCO) with a control voltage $V_{CMOD}$ which is formed from the loop's internal control signal $V_C$ and an external modulation signal MOD, which are summed in a summing circuit 110. As is characteristic of a phase-locked loop, the control voltage $V_C$ is formed with a phase comparator, which is part of the phase-locked circuit 107 (PLL), and a loop filter 108 (LPF) by creating a signal that is proportional to the phase difference between the output signal of the VCO 109 and a reference signal preprogrammed for circuit 107, and then filtering the signal in the loop filter 108 (LPF). Only those phase or frequency changes caused by the modulating signal MOD that are faster than the settling time of the loop can be detected in the output signal $f_{TX}$ of the VCO, which means that the loop has a high pass type frequency response to the modulating signal MOD.

FIG. 1 also shows a conventional heterodyne receiver in which the receiver signal $f_{RX}$ is mixed with a local frequency $f_1$ in a mixer 3 and filtered with a passband filter 4 to form an intermediate frequency $f_{IF}$. A local frequency $f_1$ is generated in an oscillator 5, which may be a phase-locked frequency synthesizer or a crystal oscillator, for example. The antenna 1 of the transceiver, a duplex filter 2 and the power amplifier 106 of the transmitter are also shown in the figure for clarity.

The frequency adjustment range of voltage-controlled oscillators used in mobile phones is about 30 MHz (e.g., when the carrier frequencies are 890–915 Mhz) and the control voltage range is less than 5 V, whereupon a one kilohertz deviation in the output frequency of the VCO corresponds to a 200 μV variation in control voltage and, as a consequence, noise in modulation signal MOD easily cause inaccuracy in output signal $f_{TX}$. Furthermore, the modulation coefficient defined as the ratio between the frequency change of VCO 109 and the corresponding change in control voltage $V_{CMOD}$ is not constant but varies as VCO output frequency $f_{TX}$ changes. As a result, the modulation coefficient changes easily from device to device and in proportion to frequency or temperature. The solution shown in FIG. 1 is advantageous from the point of view of the transmitter's energy efficiency, because the output power of the VCO 109 is applied almost directly to the transmission signal $f_{TX}$. The solution is simple but not suitable for DC modulation or digital phase modulation due to the high pass nature of its frequency response and its sensitivity to noise.

The problems of the solution shown in FIG. 1 can be partially eliminated with the solution shown in FIG. 2, in which the transmission frequency $f_{TX}$ is formed by mixing a common local frequency $f_1$ of the transceiver unit and a modulated offset frequency $f_{OFF}$ generated in an oscillator 209. The modulation coefficient can be realized according to practical requirements, whereupon, for example, a frequency deviation of about 1 KHz can be created with approximately a one volt variation in the modulating signal MOD. Either a frequency $f_1+f_{OFF}$ or $f_1-f_{OFF}$ at the output of mixer 208 is selected with passband filter 207 as the transmission frequency $f_{TX}$. The signal is attenuated approximately 10 dB in the mixer 208 and the filter 207, thus reducing the overall efficiency of the circuit when compared to the solution in FIG. 1. The signal outputted by the filter 207 is applied by amplifier 206 to the duplex filter 2. If the oscillator 209 is a crystal oscillator, for example, this construction can be used to create DC modulation. The frequencies of crystal oscillators that can be modulated are typically below 50 MHz, limiting the applicability of the solution shown in FIG. 2. The solution has further problems because it is not accurate enough for phase modulation.

The I/Q modulator 310 shown in FIG. 3 is suitable for creating controlled phase modulation. Unmodulated, constant-amplitude, transmitting frequency signal $f_C$ and signal $f_{Cp/2}$ having the same amplitude and a 90-degree phase shift as compared to signal $f_C$ are multiplied by modulating signal components I and Q in multipliers 308 and 309, respectively. The resulting signals are added together in a summing circuit 307, the output of which is the modulated transmitting frequency $f_{TX}$ to be applied by amplifier 306 to the duplex filter 2. The problem with this circuit is that the I/Q modulator 310 is difficult to implement, especially at high frequencies, because multipliers 308 and 309 must have good linearity. Multipliers 308, 309 and summing circuit 307 are usually implemented as active circuits, such as well-known Gilbert cell multipliers, whose current consumption may be tens of milliamperes. Another problem with this circuit is that it is difficult to prevent the unmodulated signal $f_C$ of transmission frequency from leaking through the multiplier into the transmission. For these reasons, instead of I/Q modulation at transmitting frequency, I/Q modulation at offset oscillator frequency $f_T$, as shown in FIG. 4, is often used. A modulated offset oscillator frequency $f_{OFF}$ is up-converted with the help of the local frequency $f_1$ to transmission frequency $f_{TX}$ which is applied by amplifier 406 to the duplex filter 2. In this circuit the modulator circuit 410 is operated at a much lower frequency than the transmission frequency, such as 90 MHz, while the transmission frequency $f_{TX}$ is about 900 MHz. The transmission frequency $f_{TX}$ is selected with filter 412 from one of the output frequencies of mixer 411, $f_1+f_{OFF}$ or $f_1-f_{OFF}$, that are mixed from frequencies $f_1$ and $f_{OFF}$. The filter also attenuates leakage of frequencies $f_1$ and $f_{OFF}$ to the transmitter. The current consumption of the structure shown in FIGS. 3 and 4 is high, mainly due to the multipliers and summing circuits 307 and 407 of I/Q modulators 310, 410, and the loss of signal energy in filter 412 of FIG. 4.

SUMMARY OF THE INVENTION

The purpose of the present invention is to eliminate the problems associated with the modulation solutions described above. The present invention can be used to construct an efficient, structurally simple transceiver that is also suitable for digital phase modulation. The present invention eliminates the need for a passband filter operating at radio frequency (RF). Additionally, the present invention can be used to implement direct digital phase modulation to transmission frequency. The invention is characterized in that, for the method, the offset frequency ($f_2$), which is input to the loop, is created by mixing the output signal ($f_{TX}$) of the adjustable oscillator with a mixture signal ($f_1$) and filtering their difference frequency signal from the result of the mixing, and wherein modulation (MOD) is added by causing a phase or a frequency change in at least one of the input signals ($f_r$, $f_2$) or their derivatives; and furthermore, for the circuit, the loop contains a mixture (507, 607, 707, 807) and a filter (508, 608, 708, 808) for creating the offset frequency ($f_2$) and means for adding modulation (MOD).

In the invention the offset frequency is formed from the output frequency of a controlled oscillator by down-converting it with a mixer signal, wherein the down-converted signal is input to the loop and the mixer signal is preferably the local frequency of the receiver, and selecting the desired mixing result with filtering. The resulting offset frequency is input to the phase comparator of the loop. The oscillator is controlled by a control signal proportional to the phase difference of the offset frequency and the reference frequency, and which control signal contains modulation information. The modulation can be implemented with known methods by adding a frequency or phase change to at least one input signal of the phase comparator or a derivative thereof. The said modulated signals are, for example, the offset frequency, the reference frequency, or derivatives thereof that are created by dividing or multiplying them.

BRIEF DESCRIPTION OF THE DRAWING

The invention is described in detail below, with references to the enclosed drawing.

DETAILED DESCRIPTION OF THE INVENTION

Figure 1:
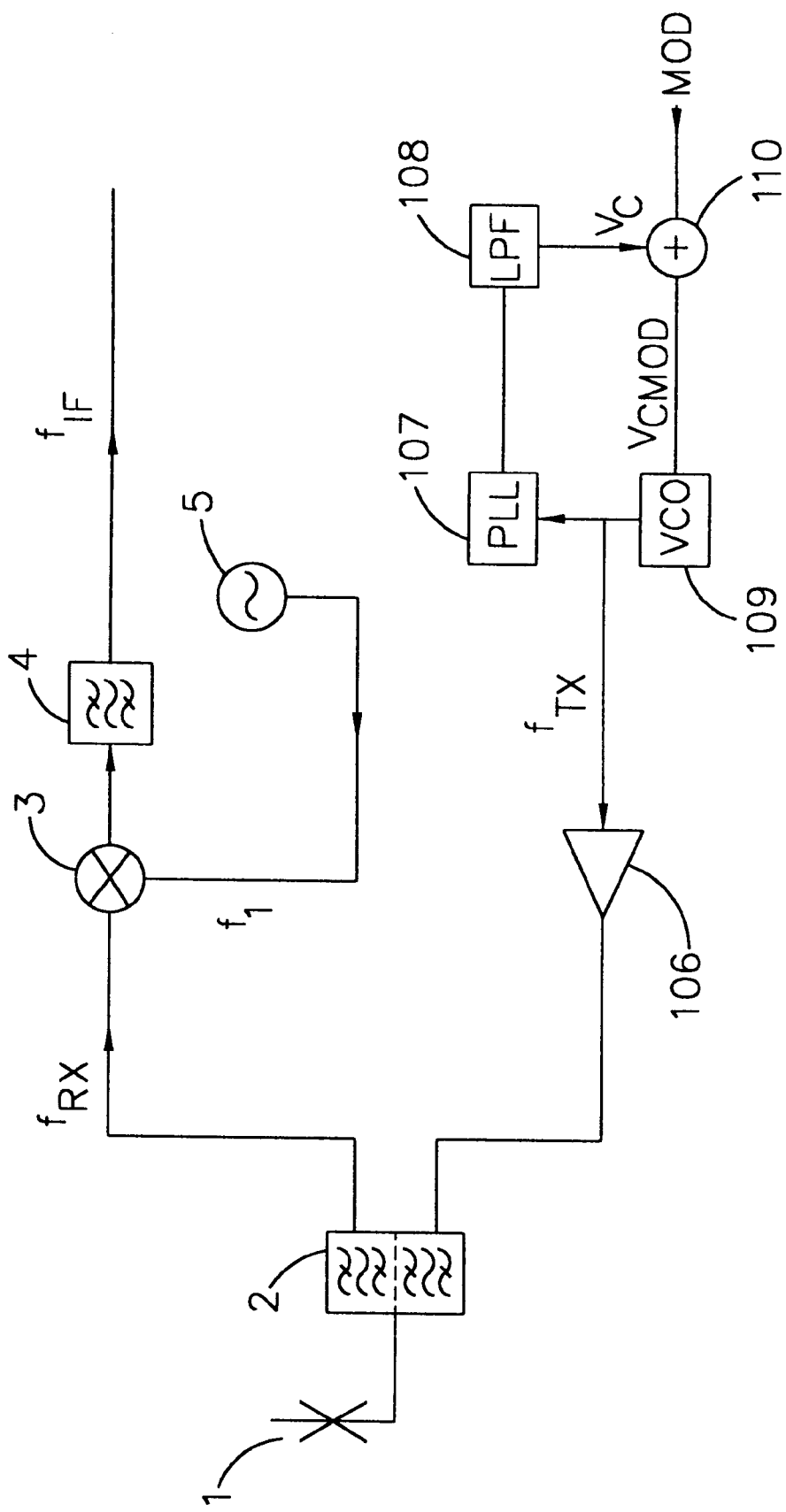
FIGS. 1–4 show principles of transceiver constructions of the prior art.
Figure 2:
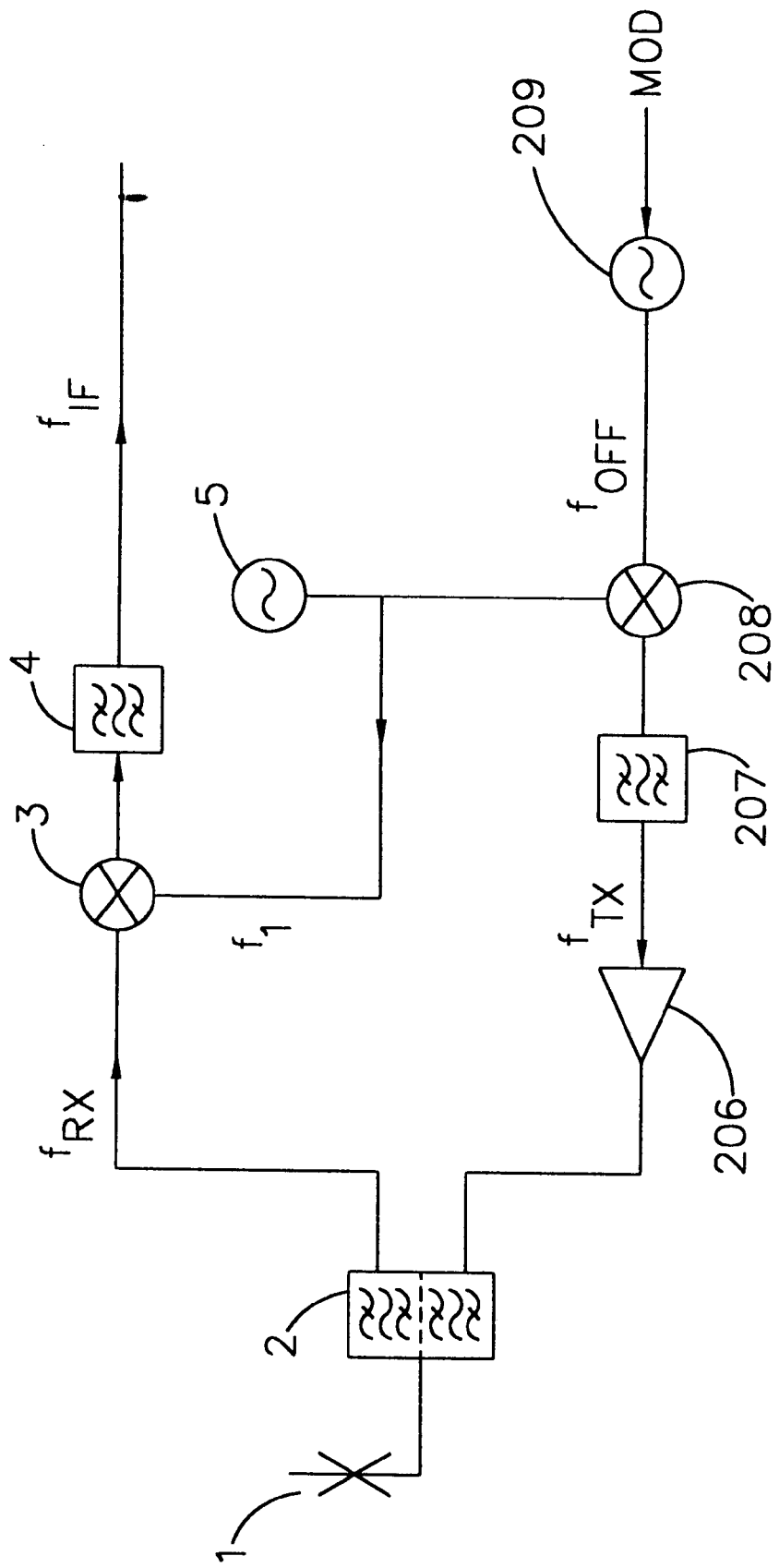
Figure 3:
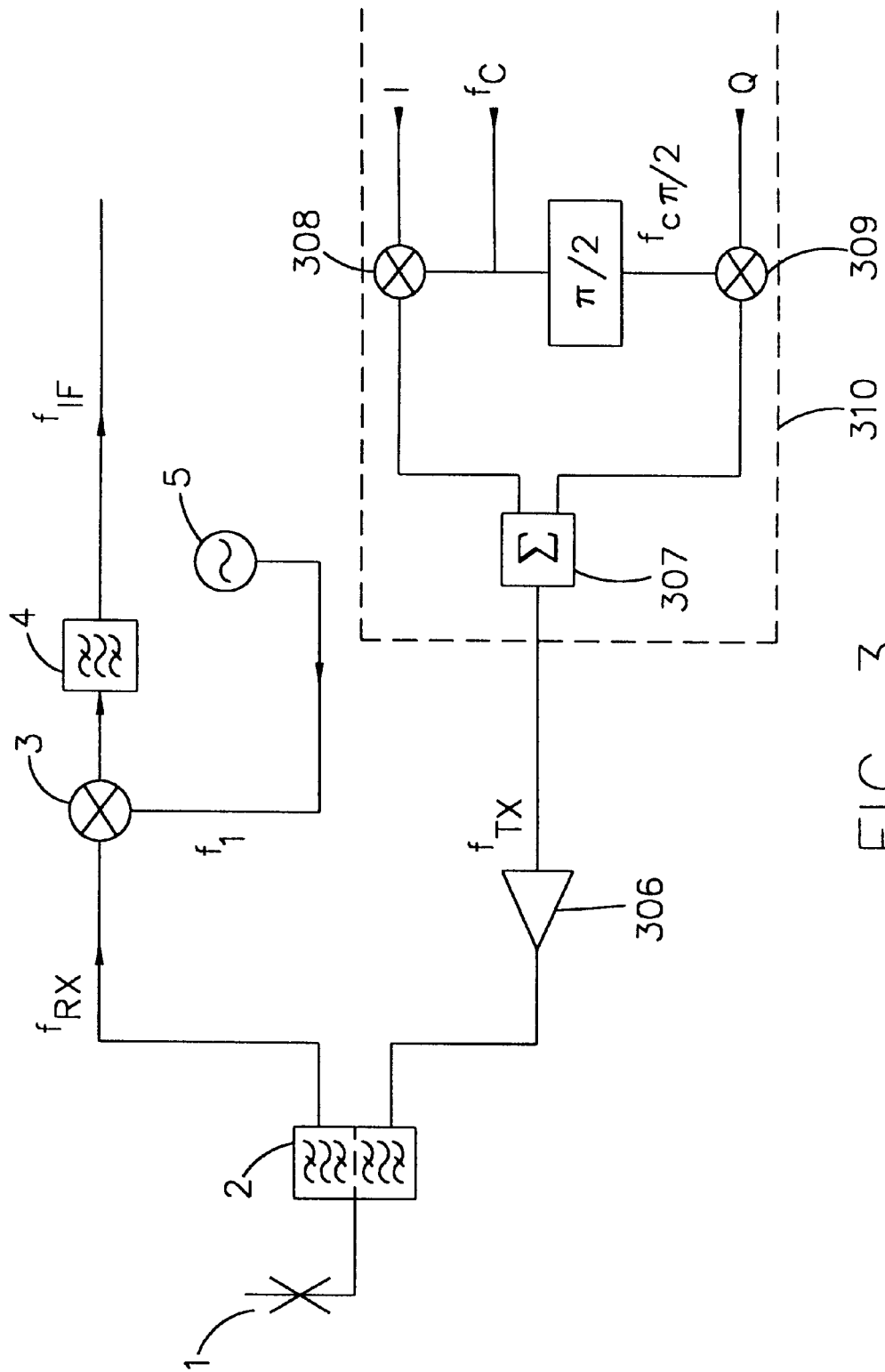
Figure 4:
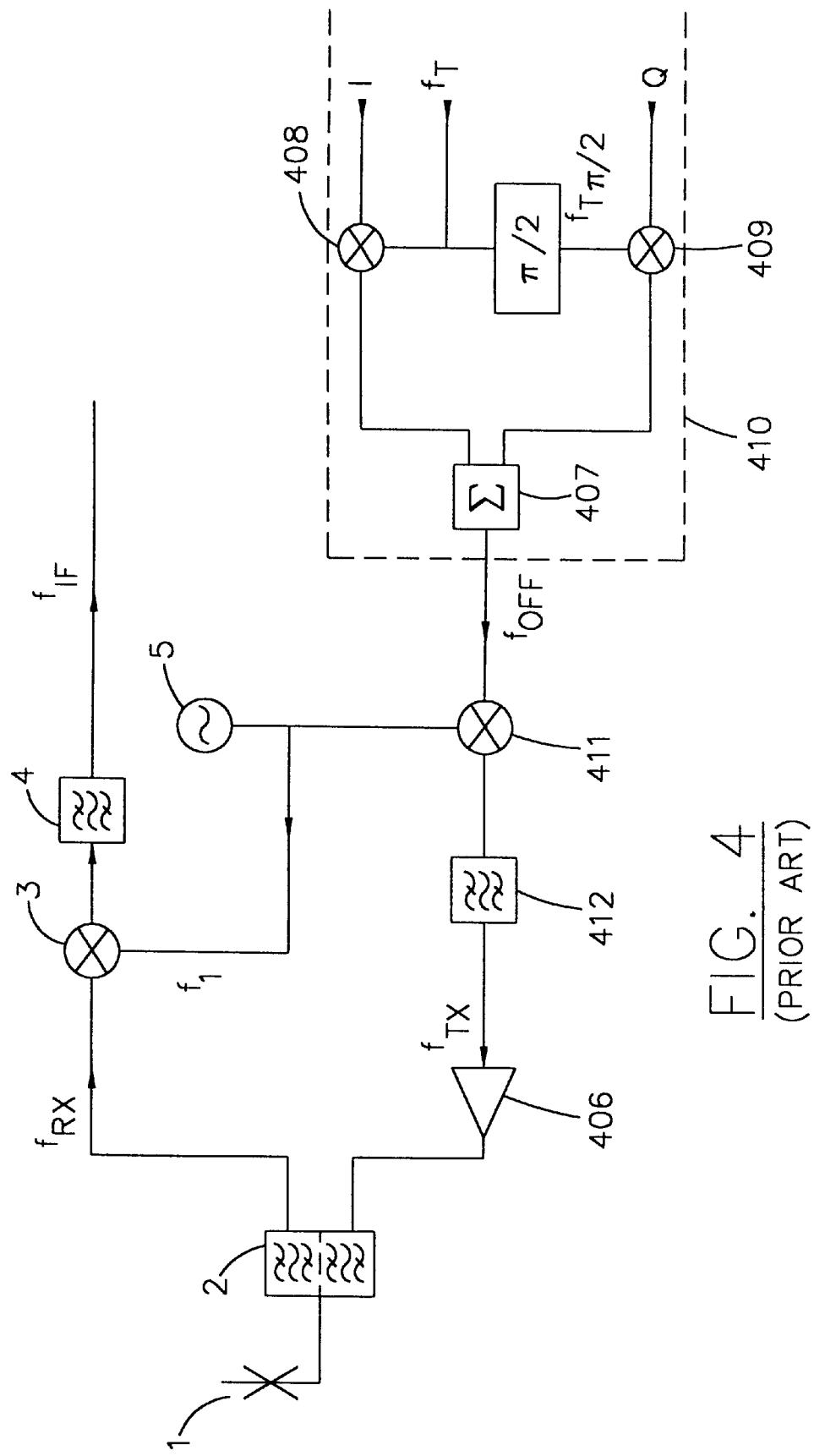
Figure 5:
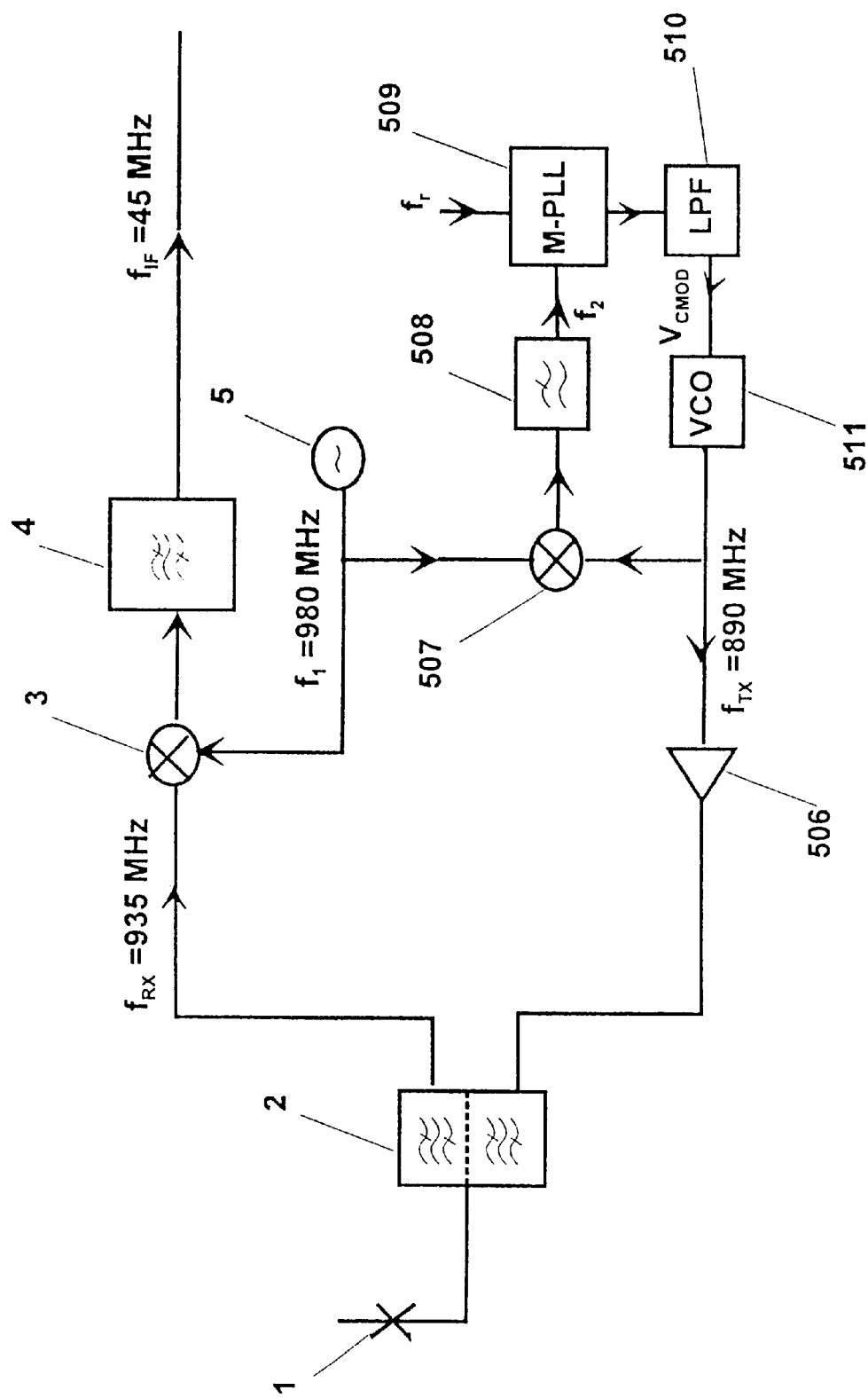
FIG. 5 shows the principle of a transceiver structure according to the invention.

The structures in FIGS. 1–4 are discussed in the general part of the present patent application. The principle of the present invention as applied to a radio transceiver is shown in FIG. 5. In the example of FIG. 5, it is assumed that the reception frequency $f_{RX}$ of the radio telephone system is 935 MHz and the transmission frequency $f_{TX}$, applied by amplifier 506 to duplex filter 2, is 890 MHz (e.g. NMT frequencies), and the first intermediate frequency $f_{IF}$ of the receiver is 45 MHz. To obtain this mixing result, local frequency $f_1$ of the receiver branch must equal $f_{RX}\pm 45$ MHz which is generated with oscillator 5 formed by VCO and PLL components, for example. The 890 MHz transmission frequency $f_{TX}$ created with controlled oscillator 511 (e.g., VCO). The oscillator's 511 transmission frequency output signal $f_{TX}$ is also input to mixer 507, where it is multiplied by a local frequency $f_1$ of the receiver branch, which in the example of FIG. 5 is 980 MHz. The mixing results in the frequencies 890±980 MHz, which are a difference frequency of 90 MHz and a sum frequency of 1870 MHz, as well as lower-amplitude leakage frequencies 890 and 980 MHz that are the result of mixer 507 being non-ideal. The 90 MHz difference frequency, later referred to as offset frequency $f_2$, is selected with low pass filter 508 and input to a modulating phase-locked circuit 509 (M-PLL), where modulation can be implemented with the present applicant's patented pulse delay technology, for example. The input signal $f_2$ of the phase-lock circuit is compared to the reference signal $f_r$ and the output of the phase-lock circuit that is proportional to their phase difference is further integrated and filtered in loop filter 510 (LPF). The output signal $V_{CMOD}$ of loop filter 510 controls the oscillator 511. The modulation created in the 90 MHz offset signal $f_2$ in the phase-locked loop is compensated by the frequency change in oscillator 511 and as a result it produces modulation in oscillator output signal $f_{TX}$.

The operation is illustrated by the following numerical example. At the beginning the frequencies are locked so that $f_1$=980 MHz, $f_{TX}$=890 MHz and their difference frequency $f_2$=90 MHz. When a frequency deviation step Df is created in the difference frequency input signal $f_2$ in the modulating PLL 509 of said structure the pulses arriving from filter 508 to the internal comparator of circuit 509 have a frequency 90 MHz+Df. The phase-locked loop now adjusts the frequency of oscillator 511 output signal $f_{TX}$ so that the frequency of the pulses arriving from mixer 507 to the phase comparator of M-PLL 509 will be reverted to 90 MHz, which happens when the frequency of oscillator 511 decreases by an amount equal to Df.

The frequency modulation added to offset frequency $f_2$ is thus transferred to a change in the output frequency of oscillator 511. It can be shown that the same is valid if phase changes are added to $f_2$ in the PLL. Modulation is possible from zero frequency upward to as high a frequency as is technically possible with the phase-locked loop.

The benefits of this solution are apparent from the above, compared to solutions implemented with the prior art. VCO 511 is used to directly modulate transmitting frequency $f_{TX}$, improving overall energy efficiency. As the modulation information is added to the lower offset frequency $f_2$ it helps to improve the accuracy of the modulation. It is essential, from the point of view of energy efficiency and production costs, that the results of mixing can be filtered with one simple low pass filter 508 instead of having to use a passband filter such as 207 in FIG. 2. Also, the actual frequency of the modulated offset signal $f_2$ is not constrained by the transmission and reception frequencies of the radio telephone system, because the offset frequency $f_2$ is not in the transmitter signal path as in the prior art shown in FIG. 2. Furthermore, because modulation takes place in a closed control loop the modulation coefficient depends only on reference frequency $f_r$, and not on transmission frequency $f_{TX}$, temperature or individual differences in the devices, for example.

By selecting the intermediate frequency $f_{IF}$ of the receiver to be e.g. 57,15 MHz instead of 45 MHz in the structure shown in FIG. 5, the other frequencies can be selected as follows (transmitting and receiving frequencies $f_{TX}$ and $f_{RX}$ according to FIG. 5):

local frequency $f_1$=877.85 MHz offset frequency $f_2$=12.15 MHz.

Filtering and processing of the 12.15 MHz offset frequency $f_2$ is easy to implement. In this case, filter 508 can be a simple RC low pass filter integrated on silicon.

Implementation of the construction in FIG. 5 requires that oscillator 511 can be locked within a wide range of frequencies (e.g., 890 MHz–915 MHz) and also can be modulated within a very small range of frequencies. Additionally, oscillator 511 must be prevented from being locked onto the image frequency $f_1+f_2$ instead of the desired frequency $f_{TX}=f_1-f_2$. This possibility exists if the offset frequency $f_2$ is less than one half of the frequency control range of oscillator 511.

Figure 6:
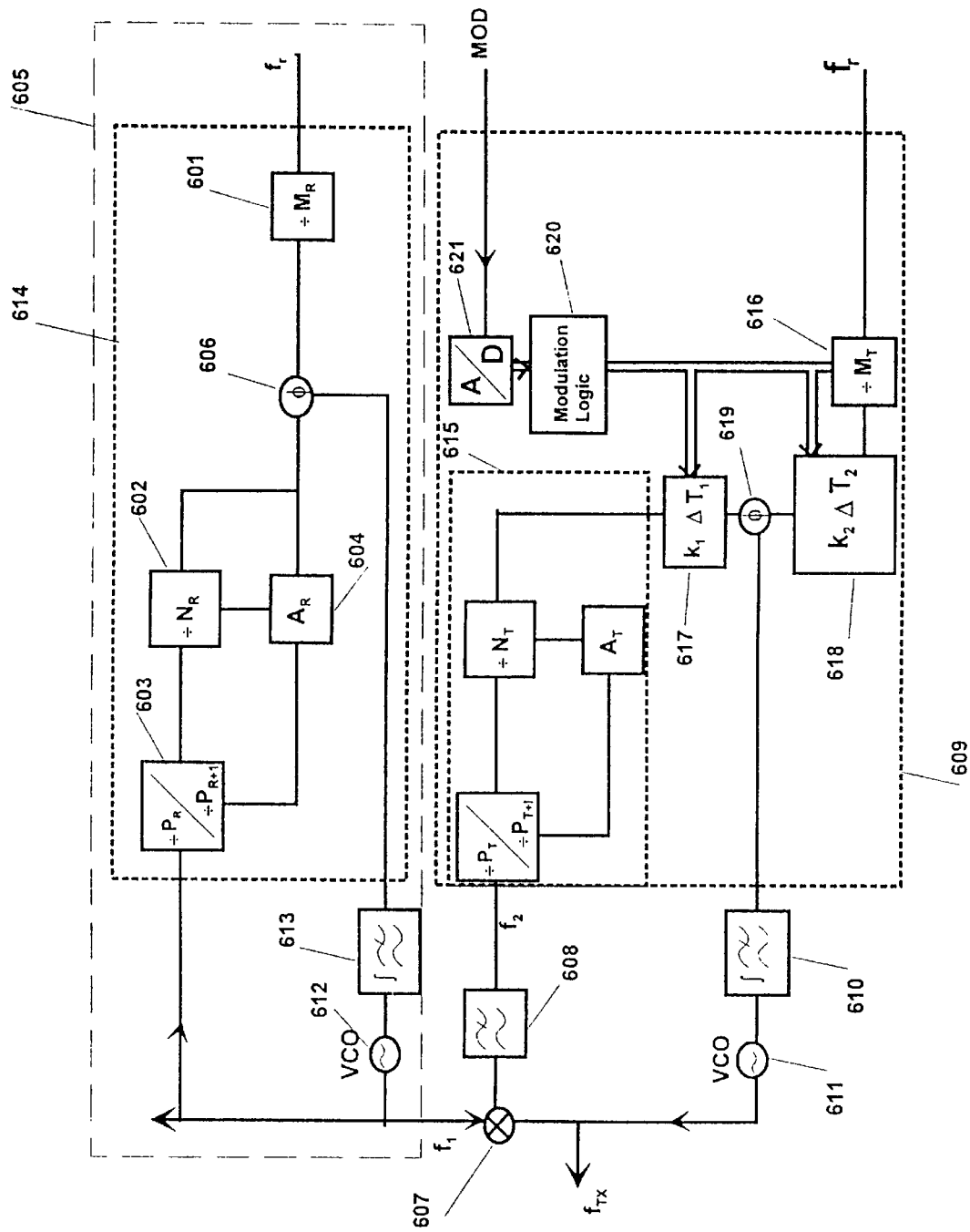
FIG. 6 shows an embodiment of the present invention in which modulation is implemented using pulse delay technology.
Figure 7:
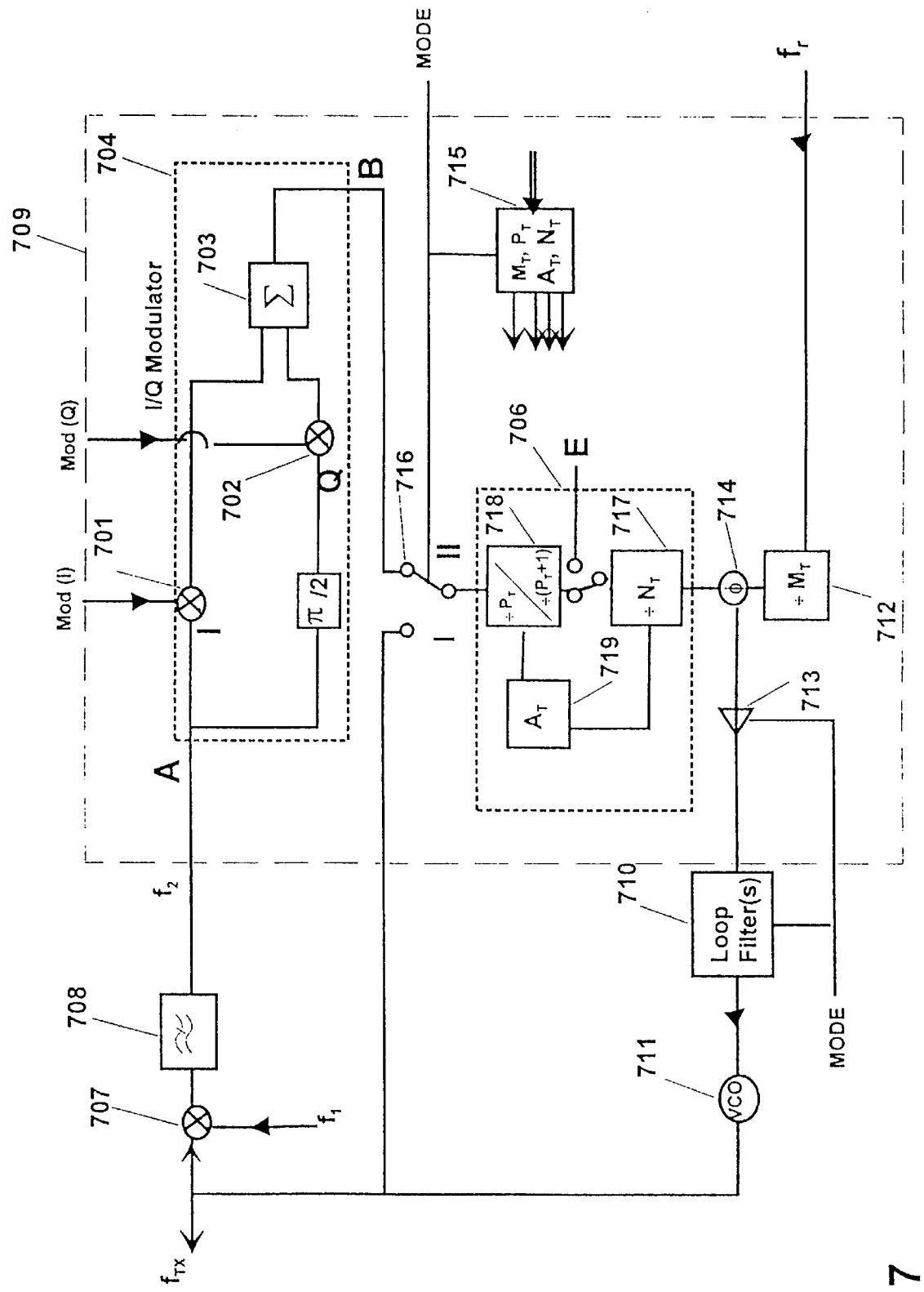
FIG. 7 shows an embodiment of the present invention in which modulation is implemented with an I/Q modulator and FIG. 8 shows an example of an implementation of a loop filter in a transceiver according to the invention.
Figure 8:
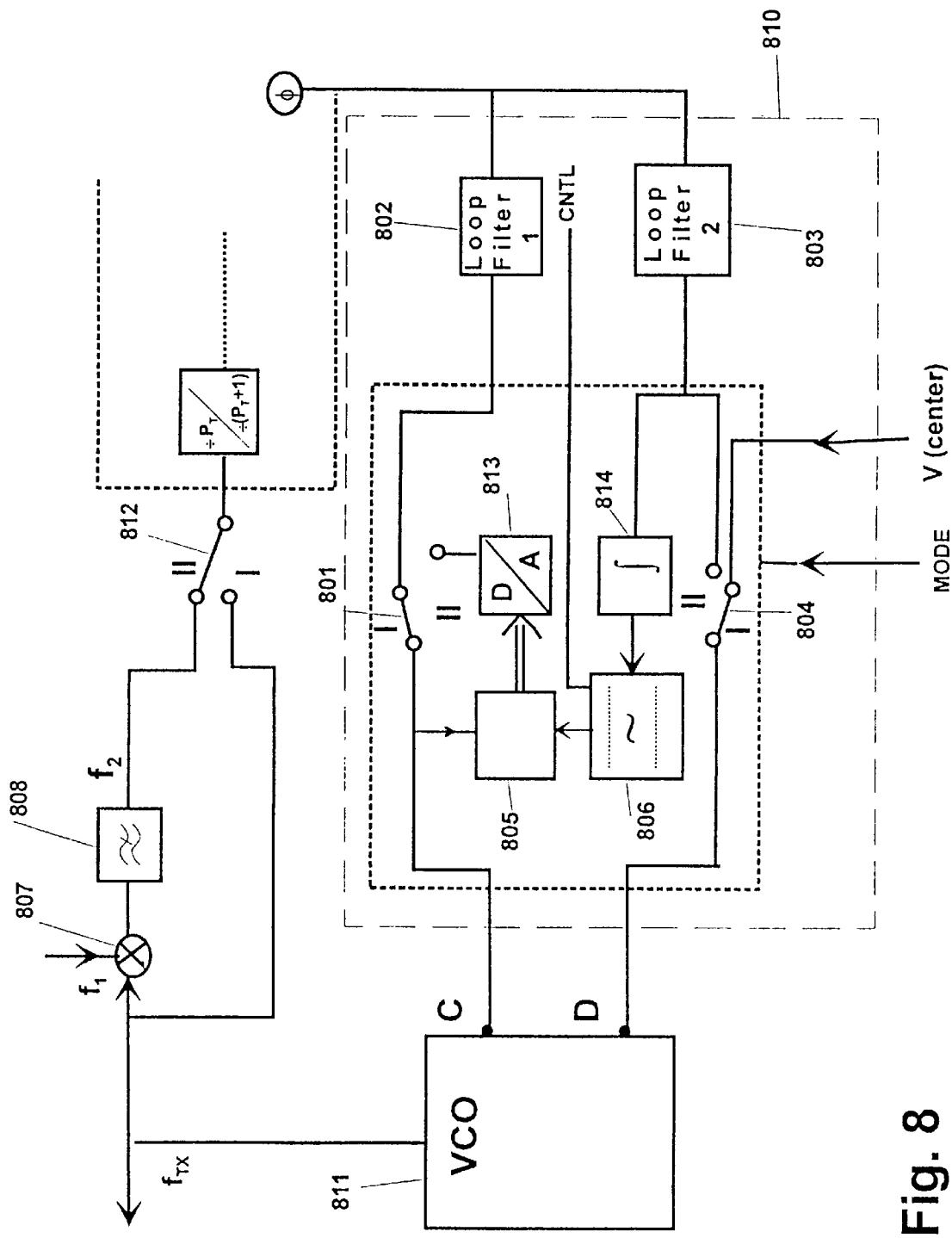

FIGS. 6, 7 and 8 show details of and supplements to the transmitting and modulating functions of FIG. 5. FIG. 6 shows a modulating solution based on pulse delay technology and FIG. 7 shows an alternative modulating solution based on an I/Q modulator as well as the principle for locking onto the correct frequency. Modulation based on pulse delay technology is presented in detail in patent publications U.S. Pat No. 5,079,520 and U.S. Pat. No. 5,325,075. FIG. 8 shows an example of a loop filter and details of its implementation.

FIG. 6 shows details of the local oscillator and the phase-locked loop of the present invention presented in FIG. 5 and creating the modulated signal to be transmitted. In this case local oscillator 5 of FIG. 5 is implemented with frequency synthesizer 605 (a dotted line frames the block). Local oscillator 605 produces local frequency $f_1$. Respectively, in the phase-locked loop of the present invention, mixer 607 corresponds to mixer 507, filter 608 corresponds to low pass filter 508, oscillator 611 corresponds to adjustable oscillator 511 and block 610 corresponds to loop filter 510. The internal structure of modulating phase-locked circuit 509 M-PLL is presented in block 609.

Local oscillator 605 is formed by a controllable oscillator 612, loop filter 613 and phase-locked circuit 614, framed by a dashed line. Local frequency $f_1$ can be expressed as $$f_1 = \frac{f_r}{M_R}(N_R P_R + A_R) \tag{1}$$

where $M_R$ is the divisor in reference frequency $f_r$ divider 601, $N_R$ is the divisor in divider 602 and $P_R$ is the divisor in dual-modulus prescaler 603, and $A_R$ is the control number in modulus controller 604 of the prescaler 603. A drive signal input to the filter 613 is provided by phase detector 606 responsive to a difference in phase between output signals of divider 602 and divider 601. Output signal $f_1$ of synthesizer 605 is mixed with transmitting frequency output signal $F_{TX}$, produced by VCO 611, in mixer 607 and filtered in low pass filter 608, according to the present invention. The result of the mixing, offset frequency $f_2$, is input to the divider circuit of phase-locked circuit 609, depicted by block 615. In the circuit, pulse frequency $f_2$ is divided by $(N_T P_T + A_T)$. Depending on the frequency of signal $f_2$, divider 615 can be based on the divider construction shown in the figure or based directly on a pulse counter. Reference frequency $f_r$ is divided by $M_T$ in divider 616.

Modulation is implemented by delaying the edges of the pulses of the signal obtained by dividing input signal $f_2$ in a delay circuit 617 and delaying the edges of the signal obtained by dividing the reference frequency $f_r$ in second delay circuit 618. The unit delays of delay circuits 617 and 618 are obtained from equations (2) and (3)

$$\Delta T_1 = \frac{1}{L}\frac{1}{f_r} \tag{2}$$

$$\Delta T_2 = \frac{1}{(L+\Delta L)f_r} \tag{3}$$

where L and $\Delta L$ are whole numbers. In the following it is assumed that $\Delta L=1$. The unit delays $\Delta T_1$ and $\Delta T_2$ are of different lengths. By selecting the coefficients $k_1$ and $k_2$ for the pulses that are input to the delay circuit and adding or subtracting whole reference frequency $f_r$ pulses, if necessary, the length of the pulses that are input to phase comparator 619 can be modified in such a way that the desired frequency or phase difference between offset frequency $f_2$ and reference frequency $f_r$ is realized. When the frequency of input signal $f_2$ is $f_1-f_{TX}$, dividing and delaying it with $k_1$ unit delays $\Delta T_1$ will yield an input signal to comparator 619 having a cycle time $T_1$ as follows:

$$T_1 = \frac{P_T N_T + A_T}{f_1 - f_{TX}} + \frac{k_1}{L f_r} \tag{4}$$

Respectively, dividing and delaying reference frequency $f_r$ will give a signal with a cycle time $T_2$ as follows:

$$T_2 = \frac{1}{f_r}\left(M_T + \frac{k_2}{L+1}\right) \tag{5}$$

When the phase-locked loop is a locked state, i.e. $T_1=T_2$, the VCO output frequency $f_{TX}$ is $$f_{TX} = f_1 - \frac{f_r(P_T N_T + A_T)}{M + \frac{k_2}{L+1} - \frac{k_1}{L}} \tag{6}$$

If 14,85 MHz is selected as the reference frequency $f_r$ and 227 as the divisor $M_T$, a 50 kHz pulse frequency will be input to comparator 619. Furthermore, if $P_T=64$, $N_T=28$ and $A_T=8$, and $k_1=k_2=0$, the transmission frequency will be $$f_{TX} = 980 \text{ MHz} - \frac{14.850 \text{ MHz } (1800)}{297} = 890 \text{ MHz}$$

If L=63, according to equation (5) the minimum frequency change will occur when the coefficients $k_1$ and $k_2$ are incremented by one for every Kth phase comparison pulse, i.e.

$$\Delta f_{min} = \tag{7}$$

$$f_r(N_T P_T + A_T)\left(\frac{1}{M_T + \frac{k_2}{L+1} - \frac{k_1}{L}} - \frac{1}{M_T + \frac{k_2+1}{L+1} - \frac{k_1+1}{L}}\right) / K$$

When $M_T \gg k_2/(L+1)$ and $M_T \gg k_1/L$, a very close approximation for equation (7) is $$\Delta f_{min} \approx \frac{f_r}{M_T}(N_T P_T + A) \times \frac{1}{K M_T L(L+1)} \tag{8}$$

which is the offset frequency $f_2$ divided by the product $K*M_T \times L(L+1)$, and the numeric value will be $\Delta f_{min}=75/K$ Hz. From equation (8) it can be seen that the smaller the predefined offset frequency $f_2$ is and the larger the value of reference divider $M_T$ used to divide reference frequency $f_r$ is the smaller the minimum frequency step $\Delta f_{min}$ will be.

By selecting 12.15 Mhz as the offset frequency $f_2$, as mentioned above, and 19.2 MHz as the reference frequency $f_r$ and 50 kHz (M=384) as the phase comparison frequency of the phase-locked loop, the minimum frequency step will be 8/K Hz, which is small enough for implementing high quality modulation of speech in a radio telephone already when K=1. This means changing the values of $k_1$ and $k_2$ at every pulse that is input to the phase comparator. This corresponds to sampling a modulating signal at a frequency of 50 kHz. The frequency step can be decreased either by using a lower offset frequency $f_2$ or by giving K a value greater than one, causing coefficients $k_1$ and $k_2$ to change less frequently. However, coefficients $k_1$ and $k_2$ must change fast enough in relation to the frequency of modulating signal MOD, because updating the coefficients corresponds to the sampling of the modulating signal.

The analog modulating signal MOD is converted to a delay control by converting it into digital form in converter 621 and further to necessary delay coefficient values $k_1$ and $k_2$ and the number of pulses to be added or subtracted by means of the modulation logic circuit 620. FIG. 7 shows an alternative for the use of the pulse delay technique for modulation and a method for ensuring that the synthesizer of the present invention locks into the correct frequency. Oscillator 711 corresponds to adjustable oscillator 511 in FIG. 5, mixer 707 corresponds to mixer 507, filter 708 corresponds to filter 508, and block 710 corresponds to loop filter 510. Block 709, framed by a dotted line, corresponds to modulating phase-locked circuit 509. Block 709 contains at least I/Q modulator 704 (framed by a dashed line), prescaler 706 (framed by a dashed line), phase comparator 714 and divider 712.

Offset signal $f_2$, resulting from down-conversion in 707, is split in I/Q modulator 704 into two I and Q components having a 90 degree phase difference, which are multiplied by modulating signals Mod(I) and Mod(Q) in multipliers 701 and 702. The results are summed in summing circuit 703. The resulting modulated offset frequency is input to divider circuit 706 and then to phase comparator 714. Reference signal $f_r$ is divided in divider 712. The phase difference signal containing modulation that is output by comparator 714 is input to loop filter 710, which was presented earlier, and whose output signal controls controlled oscillator 711.

Modulation can alternatively be implemented into reference frequency $f_r$. In this case I/Q modulator 704 is located before divider 712 in such a way that the reference frequency $f_r$ is input to modulator input A and signal B at the output of the modulator is input to divider 712.

The modulation methods according to FIGS. 6 and 7 are able to implement accurate frequency or phase steps required in digital modulation. However, in practical application of the presented modulating methods, depending on the parameters, it must be ensured that $f_{TX}$ does not lock into image frequency $f_1-f_2$ and that, on the one hand, the time constants of the PLL are suitable for changing $f_{TX}$ in the situation when channels are being changed, and on the other hand, they are suitable for realizing the desired modulation for the settled $f_{TX}$ value. To enable this function, mixer 707 and a bypass circuit for filter 708, which in this example also bypasses modulator 704, have been added to the circuit in FIG. 7. The bypass is implemented with controllable switch 716.

Two different functional states can be defined for the synthesizer with the help of the MODE control signal: a frequency locking state and a modulation state. In the frequency locking state switch 716 is in position I, whereupon VCO 711 output signal $f_{TX}$ is input directly to divider circuit 706. Because the divided frequency also affects the system response of the closed loop, the characteristics of output buffer 713 of the phase comparator and loop filter 710 are controlled to attain the desired settling time and the divisors $N_T$, $P_T$, $A_T$ and $M_T$ of divider unit 715 are set to correspond to the desired frequency. When changing over to the modulation state, the divisors and the characteristics of the loop filter of the output buffer are set to values required for modulation of oscillator 711 and switch 716 is set to position II, whereupon the input signal to divider circuit 706 is obtained from output B of modulator 704.

From the point of view of current consumption and operating cost, an advantageous variation of the circuit shown in FIG. 7 is obtained by locating switch 716 at point E, between "dual modulus" prescaler 718 and divider 717. Then, when the loop is in the modulation state, modulated offset frequency $f_2$ is input directly from point B at the output of modulator 704 to divider 717. In the frequency locking state the transmission frequency $f_{TX}$ is divided by divider circuit 706 including the prescaler 718. In this way current consuming "dual modulus" prescaler 718 and modulus counter 719 can be disconnected from the operating voltage during the modulating state, thus reducing current consumption. This state corresponds to coefficient values $A_T=0$ and $P_T=1$, and the divisor of divider circuit 706 will be $P_TA_T+N_T=N_T$.

A controlled oscillator according to the principle in FIG. 8 can be used to implement a wide control range, such as 50 MHz, and a small frequency deviation, such as 4 kHz, can be attained with only a few hertz deviation error and noise. Oscillator 811 in FIG. 8 corresponds to oscillator 511 in FIG. 5, mixer 807 corresponds to mixer 507, filter 808 corresponds to filter 508 and block 810 corresponds to loop filter 510. Switch 812 corresponds to switch 716 of FIG. 7.

In the solution shown in FIG. 8 oscillator 811 has two inputs. In the frequency-locking state, when switch 812 is in position I, switch 801 is used to select the output signal of loop filter 802 to be the control signal for VCO 811 frequency control input C, which sets frequency $f_{TX}$ to the desired value. Input C can be used for rough adjustment of the frequency of oscillator 811, for example, within the 50 MHz range. Modulation input D is used for fine adjustment of the frequency of VCO 811 within a narrow range, which is only a fraction of the whole adjustment range, such as a few hundred kilohertz. In the frequency-locking state switch 804 is used to set the control signal of modulation input D to correspond to the center of the range of adjustment with control $V_{CENTER}$. When the loop has locked into the desired frequency, input C is locked into the value it has at that moment. This is accomplished by using control unit 805 to set the output signal of memory unit 813 to the value of the output of loop filter 802 in the frequency-locking state. When changing over to the modulation state, switch 801 is set to position II, whereupon the output of memory unit 813 is input to input C. Memory unit 813 can be implemented with a D/A converter, for example. In the modulation state oscillator 811 is controlled by loop filter 803, whose output signal is input to modulation input D when switch 804 is in position II.

The circuit can also be used to eliminate e.g. temperature-related changes in the output frequency $f_{TX}$ of oscillator 811 in the modulation state that cannot be eliminated by adjusting modulation input D. This is done by measuring the average of the output signal of loop filter 803 in unit 814 and monitoring, with the help of of unit 806, whether the measured time average is within a predetermined range. If the measured time average of the output signal of loop filter 803 is outside the predefined range, the frequency range of oscillator 811 is changed, if control signal CNTL so enables, by adjusting the value of input C with the help of control unit 805 and memory unit 813.

In the transceiver described in the present invention, a modulated transmission frequency signal is created with a controlled oscillator, which is modulated in a closed phase-locked loop with the help of offset frequency $f_2$, which is down-converted from the oscillator's transmission frequency signal $f_{TX}$. The solution produces good energy efficiency in the transmitter and good modulation frequency response, which starts from zero frequency, making it possible to implement digital phase modulation. The present invention also provides methods for eliminating erroneous functions. The present invention is especially suitable for a transceiver that must be capable of quick frequency changes over a wide frequency range and controlled narrow band frequency or phase modulation.

The principle of the present invention is also suitable for constructions other than the ones described in the above examples. The controlled oscillator can also be implemented by using methods other than a VCO, such as an oscillator that is adjusted by changing the mechanical length of a resonator. Additionally, it is apparent from the description of the present invention that it can be combined with existing constructions in many ways, which can be implemented while adhering to requirements placed on transceivers, such as the frequency range or manner of modulation used in the radio system, and the internal frequencies selected for the transceiver construction and to some extent also transmitting power. Therefore embodiments and applications of the present invention are limited only by the characteristic features presented in the enclosed claims.

What is claimed is:

1. A method in a transceiver for creating a modulated transmission signal, wherein:
    the transmission signal ($f_{TX}$) is created in a frequency synthesizer based on a phase-locked loop, comprising an adjustable oscillator and a phase comparator, as an output of the adjustable oscillator,
    an offset frequency ($f_2$) is created from the output signal ($f_{TX}$) of the adjustable oscillator by down-converting its frequency,
    the offset frequency ($f_2$) and a fixed reference frequency ($f_r$) are input to the phase comparator of the phase locked loop,
    the adjustable oscillator is controlled by a control signal ($V_{CMOD}$), which contains a component resulting from the phase difference of said input frequencies ($f_r$, $f_2$), and
    a local frequency ($f_1$) is created in the receiver, primarily for mixing of received signal,
    the offset frequency ($f_2$) is created by mixing the output signal ($f_{TX}$) with the local frequency ($f_1$) of the receiver and filtering the result of the mixing so that the difference frequency signal is left over, and
    modulation (MOD) is added by causing a phase or frequency change in at least one of the input signals ($f_r$, $f_2$) or their derivatives;
    wherein the method further comprises steps of providing the adjustable oscillator with two control inputs, the first input (C) of which is input a first control signal, which sets the output frequency ($f_{TX}$) into the correct range in the frequency-locking state, and the second input (D) of which is input a second control signal, which changes the output frequency ($f_{TX}$) according to the added modulation (MOD) in the modulation state; and
    forming the first and second control signals in a loop filter from a signal proportional to the phase difference of the input signals ($f_r$, $f_2$).

2. The method according to claim 1, characterized in that the offset frequency ($f_2$) is lower than the frequencies of the output signal ($f_{TX}$) and the mixer signal ($f_1$).

3. The method according to claim 2, characterized in that the result of the mixing is low pass filtered to eliminate frequencies greater than the difference signal.

4. The method according to claim 1, characterized in that modulation (MOD) is added to the offset frequency ($f_2$) or the reference frequency ($f_r$) by means of pulse delay technology.

5. The method according to claim 1, characterized in that modulation is added by dividing the offset frequency ($f_2$) into I and Q components, multiplying said components by I and Q modulation coefficients (I(mod), Q(mod)) and adding the results together.

6. The method according to claim 1, characterized in that modulation is added by dividing the reference frequency ($f_r$) into I and Q components, multiplying said components by I and Q modulation coefficients and adding the results together.

7. A circuit in a transceiver for creating a modulated transmission signal, including:
    a frequency synthesizer based on a phase-locked loop, including an adjustable oscillator (511) and a phase comparator (509), for providing the transmission signal ($f_{TX}$) as an output of the adjustable oscillator;
    means for creating an offset frequency ($f_2$) from the output signal ($f_{TX}$) of the adjustable oscillator (511) by down-converting its frequency;
    the offset frequency ($f_2$) and a fixed reference frequency ($f_r$) being input to the phase comparator (509) of the phase locked loop;
    the adjustable oscillator (511) being controlled by a control signal ($V_{CMOD}$), which contains a component resulting from the phase difference of said input frequencies ($f_r$, $f_2$); and
    means (5) for creating a local frequency ($f_1$) in a receiver branch of the transceiver;
    wherein, for providing a modulation to the transmission signal ($f_{TX}$), the circuit comprises:
        a mixer (507) receiving the output signal ($f_{TX}$) and the local frequency ($f_1$);
        filtering means (508) connected between the mixer (507) and the phase comparator (509) for passing the difference frequency signal from the mixing result as the offset frequency ($f_2$) to the comparator (509);
        means for adding modulation (MOD) by causing a phase or frequency change in at least one of the input signals ($f_r$, $f_2$) or their derivatives
        wherein adjustable oscillator (811) has two control inputs, the first input (C) of which is input a first control signal, which sets the output frequency ($f_{TX}$) into the correct range in the frequency-locking state, and the second input (D) of which is input a second control signal, which changes the output frequency ($f_{TX}$) according to the added modulation (MOD) in the modulation state; and
        the first and second control signals are formed in a loop filter (810) from a signal proportional to the phase difference of the input signals ($f_r$, $f_2$).

8. The circuit according to claim 7, characterized in that the means for adding modulation include a first divider (615) and a first delay unit (617) which are connected to the offset frequency input ($f_2$) of a comparator (619) of the phase comparator (609), a second divider (616) and a second delay unit (618) which are connected to the reference frequency input ($f_r$), and a modulation logic (620), which controls the dividers (615, 616) and the delay units (617, 618), and which logic is controlled by a modulation signal (MOD), which is converted into digital format in an A/D converter (621).

9. The circuit according to claim 7, characterized in that the means for adding modulation include an I/Q modulator (704), which is connected to the offset frequency branch ($f_2$) of a comparator (714) of the phase comparator (709).

10. The circuit according to claim 7, characterized in that the loop contains means for bypassing the mixer and filter.

11. The circuit according to claim 10, characterized in that the means for bypassing the mixer (707) and the filter (708) include a switch (716), which, upon control, places the loop in a modulation state by connecting the mixer and the filter into the loop (II) and places the loop in a frequency-locking state by disconnecting the mixer and filter from the loop (I), whereupon the output signal ($f_{TX}$) of the oscillator is one of the input signals of the phase comparator (709).

12. The circuit according to claim 10 characterized in that the means for bypassing the mixer and filter include a loop divider.

13. The circuit according to claim 7, characterized in that filtering means include a low pass filter (508, 608, 708, 808).

14. A circuit in a transceiver for creating a modulated transmission signal, including:
  a frequency synthesizer based on a phase-locked loop, including an adjustable oscillator (511) and a phase comparator (509), for providing the transmission signal ($f_{TX}$) as an output of the adjustable oscillator;
  means for creating an offset frequency ($f_2$) from the output signal ($f_{TX}$) of the adjustable oscillator (511) by down-converting its frequency;
  the offset frequency ($f_2$) and a fixed reference frequency ($f_r$) being input to the phase comparator (509) of the phase locked loop;
  the adjustable oscillator (511) being controlled by a control signal ($V_{CMOD}$), which contains a component resulting from the phase difference of said input frequencies ($f_r$, $f_2$); and
  means (5) for creating a local frequency ($f_1$) in a receiver branch of the transceiver;
  wherein, for providing a modulation to the transmission signal ($f_{TX}$), the circuit comprises:
    a mixer (507) receiving the output signal ($f_{TX}$) and the local frequency ($f_1$);
    filtering means (508) connected between the mixer (507) and the phase comparator (509) for passing the difference frequency signal from the mixing result as the offset frequency ($f_2$) to the comparator (509);
    means for adding modulation (MOD) by causing a phase or frequency change in at least one of the input signals ($f_r$, $f_2$) or their derivatives;
    the loop contains means for bypassing the mixer and filter;
    the means for bypassing the mixer and filter include a loop divider; and
    the loop divider is made up of "dual modulus" prescaler (718) and a modulus counter (719), which form at least part of a divider circuit (706) of the input signal of the phase divider (709) in the frequency-locking state, and which are disconnected from the divider circuit (706) in the modulation state.

15. A circuit in a transceiver for creating a modulated transmission signal, including:
  a frequency synthesizer based on a phase-locked loop, including an adjustable oscillator (511) and a phase comparator (509), for providing the transmission signal ($f_{TX}$) as an output of the adjustable oscillator;
  means for creating an offset frequency ($f_2$) from the output signal ($f_{TX}$) of the adjustable oscillator (511) by down-converting its frequency;
  the offset frequency ($f_2$) and a fixed reference frequency ($f_r$) being input to the phase comparator (509) of the phase locked loop;
  the adjustable oscillator (511) being controlled by a control signal ($V_{CMOD}$), which contains a component resulting from the phase difference of said input frequencies ($f_r$, $f_2$); and
  means (5) for creating a local frequency ($f_1$) in a receiver branch of the transceiver;
  wherein, for providing a modulation to the transmission signal ($f_{TX}$), the circuit comprises:
    a mixer (507) receiving the output signal ($f_{TX}$) and the local frequency ($f_1$);
    filtering means (508) connected between the mixer (507) and the phase comparator (509) for passing the difference frequency signal from the mixing result as the offset frequency ($f_2$) to the comparator (509);
    means for adding modulation (MOD) by causing a phase or frequency change in at least one of the input signals ($f_r$, $f_2$) or their derivatives;
    wherein the loop contains means for bypassing the mixer and filter;
    the means for bypassing the mixer (707) and the filter (708) include a switch (716), which, upon control, places the loop in a modulation state by connecting the mixer and the filter into the loop (II) and places the loop in a frequency-locking state by disconnecting the mixer and filter from the loop (I), whereupon the output signal ($f_{TX}$) of the oscillator is one of the input signals of the phase comparator (709);
    adjustable oscillator (811) has two control inputs, the first input (C) of which is input a first control signal, which sets the output frequency ($f_{TX}$) into the correct range in the frequency-locking state, and the second input (D) of which is input a second control signal, which changes the output frequency ($f_{TX}$) according to the added modulation (MOD) in the modulation state; and
    the first and second control signals are formed in a loop filter (810) from a signal proportional to the phase difference of the input signals ($f_r$, $f_2$).

* * * * *